(12) United States Patent
Nanishi et al.

(10) Patent No.: US 6,458,614 B1
(45) Date of Patent: Oct. 1, 2002

(54) OPTO-ELECTRONIC INTEGRATED CIRCUIT

(75) Inventors: Yasushi Nanishi, Otsu; Michio Kadota, Kyoto, both of (JP)

(73) Assignee: Murata Manufacturing Co., (JP)

( * ) Notice: Subject to any disclaimer, the term of this patent is extended or adjusted under 35 U.S.C. 154(b) by 0 days.

(21) Appl. No.: 09/272,703

(22) Filed: Mar. 19, 1999

(51) Int. Cl.⁷ .............................................. H01L 21/00
(52) U.S. Cl. ............................ 438/31; 438/22; 438/24; 438/29; 438/30; 438/46
(58) Field of Search ............................. 438/22, 24, 29, 438/30, 31, 46

(56) References Cited

U.S. PATENT DOCUMENTS

| | | | |
|---|---|---|---|
| 5,670,798 A | * | 9/1997 | Schetzima |
| 5,810,925 A | * | 9/1998 | Tadatomo et al. |
| 5,815,520 A | | 9/1998 | Furushima |
| 5,847,397 A | * | 12/1998 | Moustakas ............. 250/370.06 |
| 5,972,730 A | * | 10/1999 | Saito et al. |
| 6,146,916 A | * | 11/2000 | Nanishi et al. |
| 6,177,292 B1 | * | 1/2001 | Hong et al. |
| 6,225,650 B1 | * | 5/2001 | Tadatomo et al. |
| 6,291,257 B1 | * | 9/2001 | Kadota |
| 6,291,258 B2 | * | 9/2001 | Kadota |

FOREIGN PATENT DOCUMENTS

| | | |
|---|---|---|
| JP | 59-029471 | 2/1984 |
| JP | 64-035405 | 2/1989 |
| JP | 05-251685 | 9/1993 |
| JP | 06334168 A | 12/1994 |
| JP | 09045960 A | 2/1997 |
| JP | 09-045960 | 2/1997 |
| JP | 09-162125 | 6/1997 |

OTHER PUBLICATIONS

Patent Abstracts of Japan; Section E; Section No. 1042; vol. 15; No. 98; p. 34; Aug. 3, 1991.
JP 09–045960 A (NEC Corp.), (Abstract), Feb. 14, 1997, In: Patent Abstracts of Japan [CD–ROM].
JP 06–334168 A (Hitachi Ltd.), (Abstract), Dec. 2, 1994, In: Patent Abstracts of Japan [CD–ROM].
JP 2–306680 A (Hikari Gijutsu Kenkyo Haihatsu K.K.). Patent Abstracts of Japan, vol. 15, No. 98 (E–1042), Mar. 8, 1991 (abstract).

* cited by examiner

*Primary Examiner*—Long Pham
(74) *Attorney, Agent, or Firm*—Dickstein, Shapiro, Morin & Oshinsky, LLP.

(57) ABSTRACT

An optical electronic integrated circuit comprises: a silicon substrate; an electronic circuit formed in the silicon substrate and processing an electric signal; a ZnO film formed on at least portion of the silicon substrate; and an optical circuit electrically connected to the electronic circuit. The optical circuit includes at least one GaN-based semiconductor compound layer which is provided on the ZnO film, and the GaN-based compound semiconductor layer either receives or emits an optical signal.

19 Claims, 4 Drawing Sheets

OPTO-ELECTRONIC INTEGRATED CIRCUIT

BACKGROUND OF THE INVENTION

1. Field of the Invention

The present invention relates to an opto-electronic integrated circuit (OEIC) which includes an electronic circuit section and an optical circuit section, and has a structure capable of effecting an inter-connection (mutual conversion) between an electrical signal and an optical signal through a light emitting or light receiving layer consisting of a compound semiconductor formed on a silicon substrate.

2. Description of the Related Art

Silicon semiconductor technology has realized transistors to ICs (Integrated Circuit) and VLSIs (Very large Scale Integrated Circuit), and it is thought the integration scale will be continually increased in the future. In recent years, with an increase in integration scale, there has arisen a concern that the operation speed of such silicon devices will be limited by a retardation of the distribution in transmitting the electric signal. In order to solve that problem, an OEIC (Optical Electronic Integrated Circuit) technique involving a signal connection with the use of light has been developed.

When such an OEIC technique is to be established, the method for forming a light emitting or light receiving layer (hereinafter, referred to as light emitting/receiving layer) consisting of a compound semiconductor on a silicon substrate has been proved to be a most important basic technique. Conventionally, as a means for integrally forming a semiconductor compound on a single crystal silicon substrate, there have been suggested mainly two types of methods. One is the so-called super hetero-epitaxial method in which a semiconductor compound forming the light emitting/receiving layer, such as a GaAs layer or InP layer, is caused to epitaxially grown on a silicon substrate. The other is a direct bonding method in which a semiconductor compound forming the light emitting/receiving layer, such as a GaAs layer or InP layer, is directly bonded to a single-crystal silicon plate by virtue of a heating treatment.

However, the above-mentioned super hetero-epitaxial method requires that semiconductor compound layers having lattice constants different from that of silicon be integrally formed on the single-crystal silicon substrate. This necessarily causes a lattice mismatch between the semiconductor compound layers and the single-crystal silicon substrate and results in generation of a misfit dislocation in the compound semiconductor layers.

On the other hand, there is a problem that the interface between the compound semiconductor layers and the single-crystal silicon substrate formed by the above-mentioned direct bonding method is subject to thermal stress due to the difference in the thermal expansion coefficient between the silicon and the compound semiconductor during cooling after the high temperature treatment employed by the direct bonding. Such a thermal stress adversely change the physical properties of the semiconductor compound layers.

In addition, the OEIC generates heat at the semiconductor compound layers or the silicon substrate during operation, and the heat increases or moves the misfit dislocation and enhances the thermal stress. As a result, there also arises a problem that the operation characteristics of the OEIC change during its operation, which degrades the reliability of the OEIC.

For the foregoing reasons, it is still difficult to actually use a semiconductor compound device having a structure in which a semiconductor compound has been formed on a silicon substrate, and also it is difficult to actually use an OEIC in which silicon element and semiconductor compound element are monolithically integrated.

SUMMARY OF THE INVENTION

It is therefore an object of the present invention to provide an improved OEIC in which a light emitting or receiving layer consisting of a semiconductor compound is monolithically formed on a silicon substrate.

The OEIC comprises a silicon substrate; an electronic circuit formed in the silicon substrate and processing an electric signal; a ZnO film formed on at least portion of the silicon substrate; and an optical circuit electrically connected to the electronic circuit. The optical circuit includes at least one GaN-based semiconductor compound layer which is provided on the ZnO film and the GaN-based semiconductor compound layer either receives or emits an optical signal.

The GaN-based semiconductor compound layer is preferably made of the conventional $Ga_{1-x}In_xN$, $Ga_{1-x}Al_xN$, $Ga_{1-x}B_xN$ or mixed crystal thereof, and is formed at a temperature of 800° C. or lower. It is more preferable to employ an ECR-MBE method for forming the GaN-based semiconductor compound layer.

The OEIC may further comprise an optical waveguide which is made of ZnO and optically connected to the optical circuit. Alternatively, the OEIC may further comprise a $SiO_2$ film between the silicon substrate and the ZnO film while the ZnO film is optically connected to the optical circuit so as to act as an optical waveguide.

The electronic circuit preferably includes at least one MOSFET, and the optical circuit preferably includes at least one light emitting diode, laser or photodiode.

According to the present invention, since a ZnO film is formed to serve as a buffer layer, the GaN layer formed on the buffer layer has fewer misfit dislocations, thereby obtaining a good crystallinity.

Further, since the ZnO film serving as a buffer layer may be formed at a relatively low temperature with a method such as sputtering, it inhibits bad influences caused by high temperature and possibly brought to the metal wires of the electronic circuit section of an OEIC. Moreover, since the metal wire section is covered by the ZnO film, the metal wires may be protected from direct exposure to high temperature during the process for forming the GaN layer, thereby effectively inhibiting the above-mentioned bad influence. At this time, since an ECR-MBE method is used to form the GaN layer, the GaN layer may be formed at a relatively low temperature, thereby further inhibiting a possible bad influence to the metal wire section.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

The inventors of the present invention have conducted active research and have found that a ZnO layer can be suitably used as a buffer layer between a semiconductor compound layer and a silicon substrate or silicon layer.

A ZnO film (or layer) formed on a silicon substrate is usually orientated in a direction of axis c and the difference of the lattice constants between the ZnO film on the silicon substrate and the GaN film is only 2%. Therefore, it is possible to inhibit the misfit dislocation which is otherwise caused due to the lattice mismatch, making it possible to form a semiconductor compound having fewer dislocations and good film quality.

The semiconductor compound layer used in the present invention is preferably made of a III–V semiconductor compound, and more specifically, made of $Ga_{1-x}In_xN$, $Ga_{1-x}Al_xN$, $Ga_{1-x}B_xN$ or mixed crystal thereof, i.e., GaN-based materials. These materials are suitable for a light emitting/receiving layer or an active layer for laser devices. Differences of the lattice constant between these materials and the ZnO film on the silicon substrate are so small that the semiconductor compound layers of these material formed on the ZnO film include less dislocations. In addition, these materials are not likely to degrade in light emitting/receiving characteristics regardless of existence of a small number of dislocations. Therefore, these semiconductor compounds can be suitably used to form an OEIC required to emit or receive light stably.

Further, another advantage which may be obtained by using the ZnO film is that the ZnO film can be formed at a relatively low temperature (at most 300° C.) with the use of a method such as sputtering. In an OEIC, the electronic circuit section and the optical circuit section are formed respectively with the use of different materials. This causes various problems due to different conditions for forming these sections. In particular, since the process of high temperature treatment is necessary for growing a semiconductor compound serving as a light emitting/receiving layer, metallization or metal wiring in the electronic circuit section is degraded by the high temperature treatment. One of the most important advantages obtainable in the present invention is that a buffer layer of ZnO may be formed at a temperature of 300° C. or lower, which temperature is low enough so that there will be almost no bad influence to the metallization. Further, since the metallization is covered by the ZnO film during the process of high temperature treatment for growing the GaN layer, the metallization may avoid being directly exposed to the high temperature. In this way, since the ZnO film can act as a passivation film during the high temperature treatment, it is possible to inhibit possible bad influences on the metallization. According to the results of our experiments, it has been confirmed that when the ZnO film is formed so as to cover the metallization, and when the film formation temperature for forming the light emitting/receiving layer is kept at 800° C. or lower, the bad influence on the metallization may be controlled within an allowable range. In the case where a polyimide material or the like is interposed as a protection layer between the ZnO film and the metallization, it is possible to further inhibit some bad influence to the metal wires, although adding such protection layer will cause the manufacturing process to become complex to some extent.

The above-mentioned semiconductor compound layer can be formed at a relatively low temperature (700° C.) using an ECR-MBE (Electron Cyclotron Resonance Molecular Beam Epitaxy) method. This method for forming the semiconductor compound layer is explained, for example, in U.S. application Ser. No. 09/201,924, German Patent Application 19855476.1 and Japanese Patent Application No. 9-331884, the disclosures of which is hereby incorporated by reference. According to the present invention, since the process temperature for growing the semiconductor compound layers can be limited to 700° C. or lower by using the ECR-MBE method, it is possible to greatly reduce the adverse effects to the metallization in combination with the function of the passivation film. It is, however, to be noted that film formation methods other than the above-discussed ECR-MBE method may be employed as long as the semiconductor compound layer is formed at a temperature of 800° C. or lower.

The above-explained ZnO film may be also used as an optical waveguide in the OEIC. This simplifies the structure of the OEIC. Further, since the optical signal may be transmitted without using an optical fiber, it is not necessary to install an optical fiber to the OEIC, thereby also simplifying a manufacturing process of the OEIC. A $SiO_2$ layer having a lower refractive index than ZnO may be interposed between the silicon substrate and a ZnO film serving as a optical waveguide way.

Hereinafter, the preferred embodiments of the present invention are explained in detail with reference to the drawings.

First Embodiment

Figure 1:
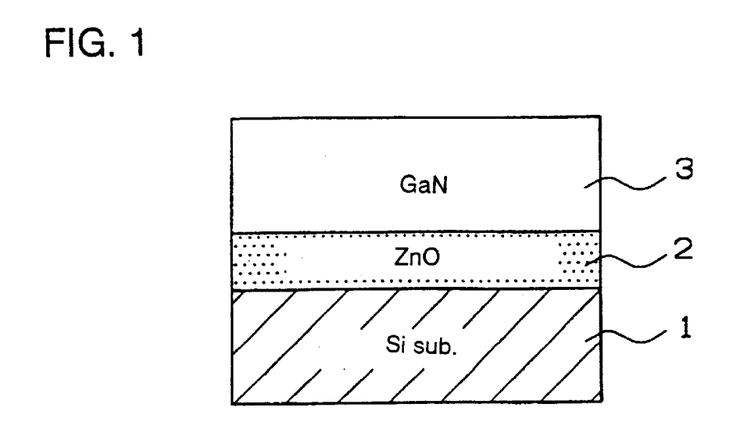
FIG. 1 is a partial sectional view showing an essential structure of an OEIC according to the first embodiment of the present invention.

FIG. 1 is a partial sectional view showing the structure an OEIC according to the first embodiment. As shown in FIG. 1, a ZnO film 2 is provided on a silicon substrate 1 and a GaN layer 3 is further provided on the ZnO film 2. The ZnO film 2 serves as a buffer layer helping to form the GaN layer 3 thereon. The GaN layer 3 generally represents a semiconductor compound layer which can emit or receive light. The structure of the OEIC shown in FIG. 1 is formed by the following processes.

First of all, it is necessary to prepare a single-crystal silicon substrate 1 which is usually used to form a silicon semiconductor element.

Then, a ZnO film having a thickness of about 3 $\mu m$ is formed on the silicon substrate 1 with the use of a method such as RF magnetron sputtering. The ZnO film 2 is a polycrystal film orientated in a direction of axis c and serves to provide a function as a buffer layer for forming the GaN layer 3. Any thickness which performs that function can be employed. During the formation of the ZnO film 2 by a RF magnetron sputtering method, the desired film is formed while the silicon substrate is being heated. The silicon substrate 1 can be heated at a temperature of about 300° C. at most, while the silicon substrate 1 is typically kept at a temperature of about 200° C.

After the ZnO film 2 is formed in the above manner, the GaN layer 3 is formed on the ZnO film 2. The GaN layer 3 may be formed with the use of an ECR-MBE method. In more detail, ECR-MBE apparatus (not shown) including a plasma formation area and a film formation area is used to induce an electronic cyclotron resonance (ECR) phenomenon in the plasma formation area, thereby producing a plasma of nitrogen gas. Then, the plasma is supplied to the film formation area, and is caused to react with Ga metal supplied from Knudsen cells provided in the same film formation area, so as to form the desired GaN layer 3 on the ZnO film 2 in the film formation area. When the GaN layer 3 is formed with the use of the ECR-MBE method, since the raw material gas has already been in its highly energized state because of an ECR plasma condition in which it is in, it is sure to exactly form the GaN layer 3 even if the temperature of the substrate is not increased any further. In more detail, if the temperature of the silicon substrate is set at about 700° C., the GaN layer 3 is formed without any difficulty. In this embodiment, the GaN layer 3 was formed at the substrate temperature of 720° C.

Second Embodiment

An OEIC of the second embodiment of the present invention will be described in detail below with reference to FIG. 2.

Figure 2:
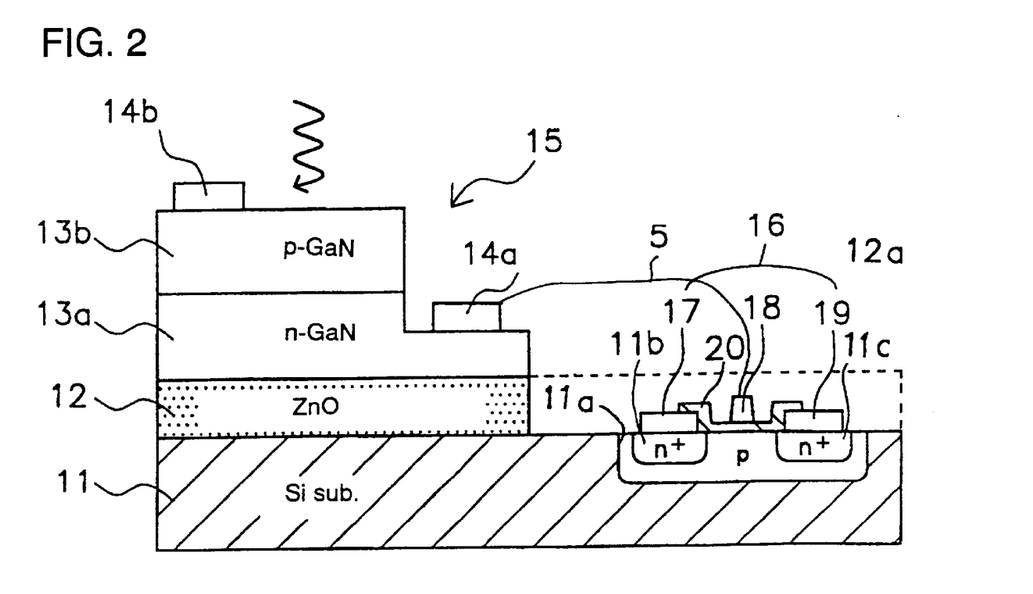
FIG. 2 is a cross sectional view showing an OEIC according to the second embodiment of the present invention.

FIG. 2 is a cross sectional view showing an OEIC according to the present embodiment. A photodiode is formed as an optical circuit comprising a light emitting/receiving layer on a ZnO film 12 which is provided on a single-crystal silicon substrate 11. A field effect transistor (MOSFET) 16 is formed as an electronic circuit on the same substrate 11. The photodiode is electrically connected to the MOSFET 16 through wiring 5. The photodiode 15 and the MOSFET 16 may be electrically connected by metallization (not shown) formed on the silicon substrate 11.

In the MOSFET 16, a p-type region 11a is formed in the silicon substrate 11 and a source region 11b and a drain region 11c respectively formed of n-type region are formed in the p-type region 11a. A source electrode 17 and a drain electrode 19 are formed on the source region 11b and the drain region 11c, respectively, and a SiO$_2$ layer 20 is provided on the silicon substrate 11 so as to cover a region of the p-type region 11a between the source region 11b and the drain region 11c. A gate electrode 18 is provided on the SiO$_2$ layer 20.

In the photodiode 15, an n-type GaN layer 13a is formed on the ZnO film 12 and a p-type GaN layer 13b is formed on the n-type GaN layer 13a so as to form a p-n junction. An n-type electrode 14a and a p-type electrode 14b are respectively provided on the n-type GaN layer 13a and the p-type GaN layer 13b so as to form an ohmic junction, respectively. The n-type GaN layer 13a and the p-type GaN layer 13b act as a light receiving layer and light entering the p-type GaN layer 13b generates carriers to cause a potential difference between the n-type electrode 14a and the p-type electrode 14b, thereby converting the light signal into an electric signal. The converted electric signal is fed to the MOSFET 16 as a control signal of the MOSFET 16.

When manufacturing an OEIC according to the present embodiment, the MOSFET 16 is first formed by using known various processes used in a silicon semiconductor field such as a photo-lithograph, ion implantation, etching treatment and so on.

Next, the same method discussed in the first embodiment is used to form the ZnO film 12, the n-type GaN layer 13a and the p-type GaN layer 13b except that the n-type GaN layer 13a and p-type GaN layer 13b are doped with impurities such as Si and Mg so as to form respective conductivity types. At the time, it is important to form the ZnO film 12 on the silicon substrate 11 at least so as to cover the MOSFET 16 as indicated by dotted line 12a. After that, a process such as reactive ion etching (RIE) is used to remove unwanted portions of the p-type GaN layer 13b, the n-type GaN layer 13a and the ZnO film 12. Although FIG. 2 shows that the MOSFET 16 is exposed by removing a portion 12a of the ZnO film 12, the portion 12a may not be removed. Further, the n-electrode 14a and the p-type electrode 14b are formed on the n-type GaN layer 13a and the p-type GaN layer 13b, respectively, thereby forming a photodiode 15. In this way is formed an OEIC capable of converting an external optical signal into an electric signal by virtue of the photodiode 15, and controlling the operation of the MOSFET 16 by virtue of the electric signal.

According to this structure, when the GaN layers 13a and 13b are formed under a condition of a high temperature, it may be ensured that various metal wires of the MOSFET section 16 serving as an electronic circuit section are protected by the ZnO film 12, so that these metal wires avoid being directly exposed to high temperature, therefore making it possible to inhibit deterioration in the operation performance of the MOSFET section 16, and thus properly maintaining the desired operation performance of an OEIC.

Although in the above embodiments a light receiving layer is formed of GaN, the present invention should not be limited to such specific example. In fact, it is also possible that a light receiving layer may be formed from other materials such as AlGaN, InGaN, InGaAlN. Further, although it has been described in the above embodiments that an MOSFET is formed which can serve as an electronic circuit section, in fact it is also possible to form other sorts of active element. It is also apparent to the person skilled in the art that a plurality of active elements may be formed in the silicon substrate to form a logic circuit or any other circuits. Moreover, in the present embodiment, although it has been described that an optical circuit 15 is formed after the formation of an electronic circuit 16, it is also possible that an electronic circuit 16 is formed after the formation of an optical circuit 15.

Third Embodiment

Figure 3:
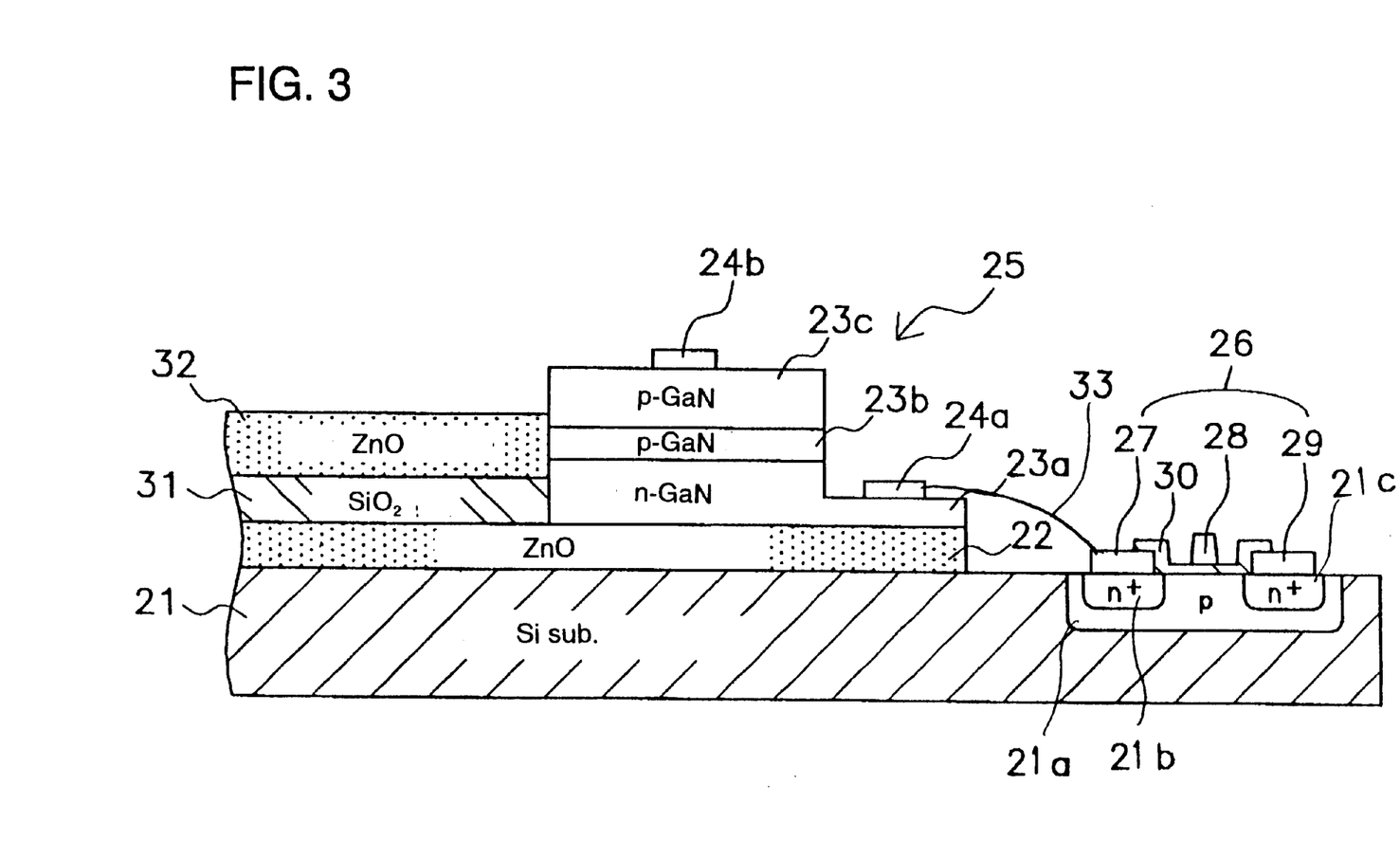
FIG. 3 is a cross sectional view showing an OEIC according to the third embodiment of the present invention.

An OEIC of the third embodiment of the present invention will be described in detail below with reference to FIG. 3.

The OEIC according to the third embodiment of the present invention includes a laser section 25, a optical waveguide 32 and a MOSFET 26 on a single silicon substrate 21. The laser section 25 and the optical waveguide 32 are formed on or over a ZnO film 22 which is provided on the silicon substrate 21.

The MOSFET 26 formed in the silicon substrate 21 has the same structure as the MOSFET 16 shown in FIG. 1. That is, a p-type region 21a is formed in the silicon substrate 21 and a source region 21b and a drain region 21c respectively formed of a n-type region are formed in the p-type region 21a. A source electrode 27 and a drain electrode 19 are formed on the source region 21b and the drain region 11c, respectively, and SiO$_2$ layer 30 is provided on the silicon substrate 21 so as to cover a region of the p-type region 21a between the source region 21b and the drain region 21c. A gate electrode 18 is provided on the SiO$_2$ layer 30.

The laser 25 comprises an n-type GaN cladding layer 23a, a p-type GaN active layer 23b and a p-type GaN cladding layer 23c. These layers 23a, 23b and 23c are provided on the ZnO film 22 so that the p-type GaN active layer 23b is interposed between the n-type GaN cladding layer and the p-type GaN cladding layer 23c. An n-type electrode 24a and an p-type electrode 24b are provided on the n-type GaN cladding layer 23a and the p-type GaN cladding layer 23c, respectively.

The optical waveguide 32 is made of ZnO and provided on a SiO$_2$ film 31 which is formed on the ZnO film 22. The optical waveguide 32 covers the side face of the p-type active layer 23b and the peripheral side regions of the junctions between the p-type GaN cladding layer 23c and the p-type GaN active layer 23b and between the n-type GaN cladding layer 23a and the p-type GaN active layer 23b so that the optical waveguide 32 is optically connected to the laser 25. Since the SiO$_2$ film 31 has a refractive index smaller than the optical waveguide 32, a laser beam emitted from the laser 25 is effectively confined in the optical waveguide 31.

The MOSFET 26 and the laser 25 are electrically connected by, for example, wiring 33, whereby laser 25 is controlled by a gate voltage applied to the gate electrode 28 of the MOSFET 26.

Since the optical waveguide 32 can be formed using the same material of the ZnO film 22, it is possible to simplify the manufacturing formation process. Further, since an optical signal may be transmitted without using an optical fiber, one can dispense with the troublesome installing operation for installing an optical fiber, thereby further simplifying the manufacturing process for manufacturing an OEIC.

In the present embodiment, the SiO$_2$ layer 31 is formed beneath the optical waveguide 32 as a cladding layer of the optical waveguide 32 since SiO$_2$ is a very common material to the silicon semiconductor devices and the manufacturing process can be simplified by using SiO$_2$. However, it is possible to employ a film made of another material as long as the material has a refractive index smaller than the ZnO.

Further, although in the present embodiment the clad layer is formed by an n-type GaN layer 23a and p-type GaN layer 23c while the active layer is formed by a p-type GaN layer 23b, it is also possible to form n-type AlGaN clad layer, p-type AlGaN clad layer and p-type InGaN active layer. In addition, the active layer of the laser 25 may have a single-quantum well structure or multi-quantum well structure employing InGaN and GaN.

Fourth Embodiment

An OEIC of the fourth embodiment of the present invention will be described in detail below with reference to FIG. 4.

An OEIC according to the fourth embodiment of the present invention is formed in a manner such that on the silicon substrate layer 41 there are formed a light emitting diode 45 and a photodiode 53 each serving as a light emitting/receiving layer, an optical waveguide 52 formed of a ZnO material serving as an optical circuit section, and a MOSFET 46 serving as an electronic circuit section. By adjusting the voltage applied to a gate electrode 48 of the MOSFET 46, it is sure to form an OEIC capable of controlling a light emission of a light emitting diode 45.

Figure 4:
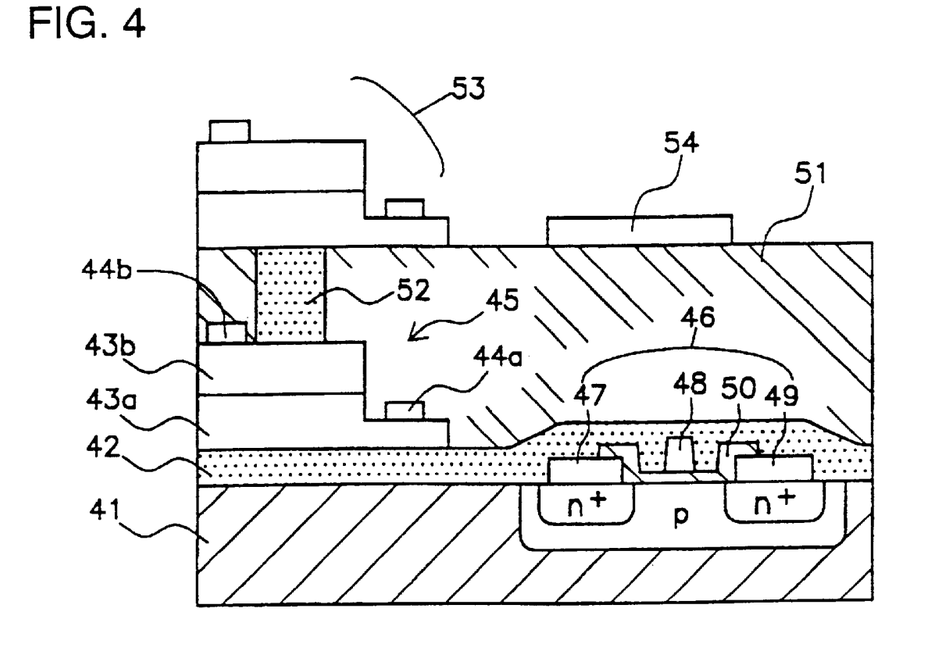
FIG. 4 is a cross sectional view showing an OEIC according to the fourth embodiment of the present invention.

FIG. 4 is a cross sectional view showing an OEIC according to the present embodiment. Since the structure of MOSFET 26 of the fourth embodiment is just the same as that of the second embodiment, a description thereof is omitted here. As shown in FIG. 3, MOSFET 46 is formed in a silicon substrate 41 and a ZnO film 42 is formed on the surface of the silicon substrate 41 so as to cover the MOSFET 46. A light emitting diode 45 having an n-type GaN layer 43a and a p-type GaN layer 43b is formed on the ZnO film 42. An n-type electrode 44a and a p-type electrode 44b is electrically connected to the n-type GaN layer 43a and the p-type GaN layer 43b, respectively.

A SiO$_2$ film 51 is formed on the ZnO film 42 and the light emitting diode 45 so as to cover the light emitting diode 45. A though hole exposing a portion of a surface of the p-type GaN layer 43b is provided in the SiO$_2$ film 51 and an optical waveguide layer 52 is formed in the through hole so as to be optically connected to the light emitting diode 45. A photodiode 53 is formed on the optical waveguide 52 so as to receive a optical signal emitted from the light emitting diode 53. An electronic element 54 such as an inductor is also provided on the SiO$_2$ film 51.

According this structure, the optical waveguide 52 can successfully confine the optical signal transmitting in the optical waveguide 52 by providing a SiO$_2$ film 51 having a refractive index smaller than the ZnO around the optical waveguide 52.

In addition, since an optical signal may be transmitted in a desired manner without using an optical fiber, one can dispense with the troublesome installing operation for installing an optical fiber, thereby further simplifying a manufacturing process for manufacturing an OEIC.

Fifth Embodiment

Figure 5:
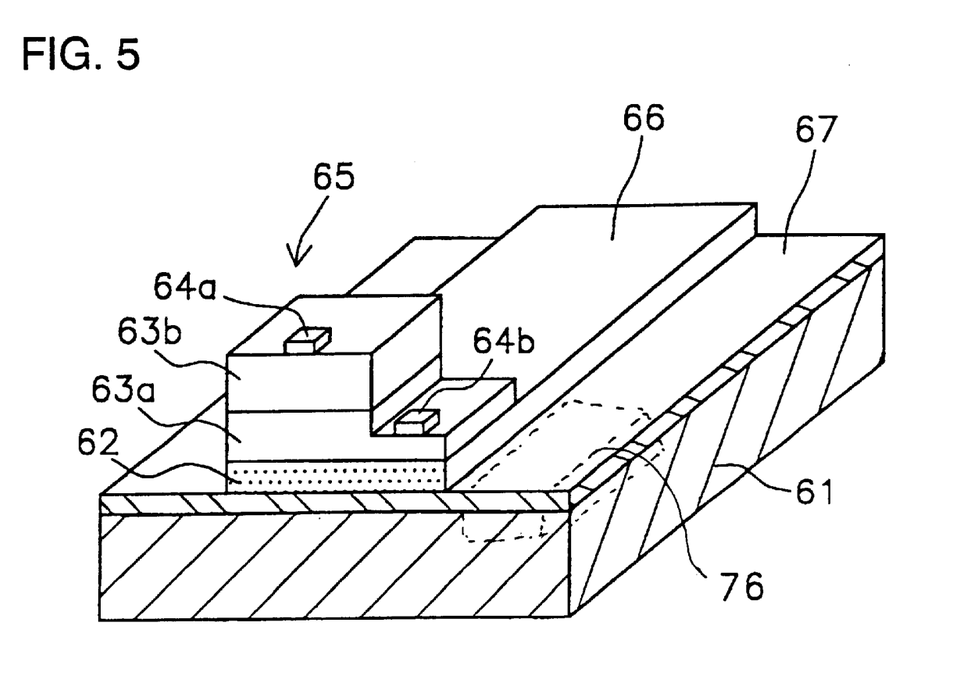
FIG. 5 is a perspective view showing an OEIC according to the fifth embodiment of the present invention.

A fifth embodiment of the present invention will be described in detail below with reference to FIG. 5.

The OEIC according to the fifth embodiment of the present invention comprises a silicon substrate 61, a MOSFET 76 formed in the silicon substrate, a light emitting diode 65 and a ZnO film 66 which also acts as an optical waveguide and is provided between the silicon substrate 61 and the light emitting diode 65. A SiO$_2$ layer 67 is formed on the silicon substrate 67 so as to cover the MOSFET 76 and the ZnO film 66 is formed on the SiO$_2$ layer 67. The light emitting diode 65 is formed on the ZnO film 66 so as to be optically connected with the ZnO film 66.

The light emitting diode 65 comprises a n-type GaN layer 63a and a p-type GaN layer 63b, and an n-type electrode 64b and p-type electrode 64a are electrically connected to the n-type GaN layer 63a and the p-type GaN layer 63b, respectively. The MOSFET 76 is used to control the emission of the light emitting diode 65.

According to this structure, since the SiO$_2$ film 67 has refractive index smaller than ZnO, it is possible to confine the optical signal in the ZnO film 66 so as to act as an optical waveguide. Accordingly, the ZnO film 66 can work as both a buffer layer for forming a GaN layer and an optical waveguide. This greatly simplifies the production steps as it is not necessary to form an optical waveguide separately.

Although in the above-explained OEIC, the SiO$_2$ film 67 is employed between the ZnO film 66 and the silicon substrate 61, other films having a refractive index smaller than ZnO may be used. Further, another SiO$_2$ film or another film having a refractive index smaller than ZnO may be formed on the top surface of the ZnO film 66 so as to increase the transmission efficiency of the ZnO film 66 as an optical waveguide.

Sixth Embodiment

Figure 6:
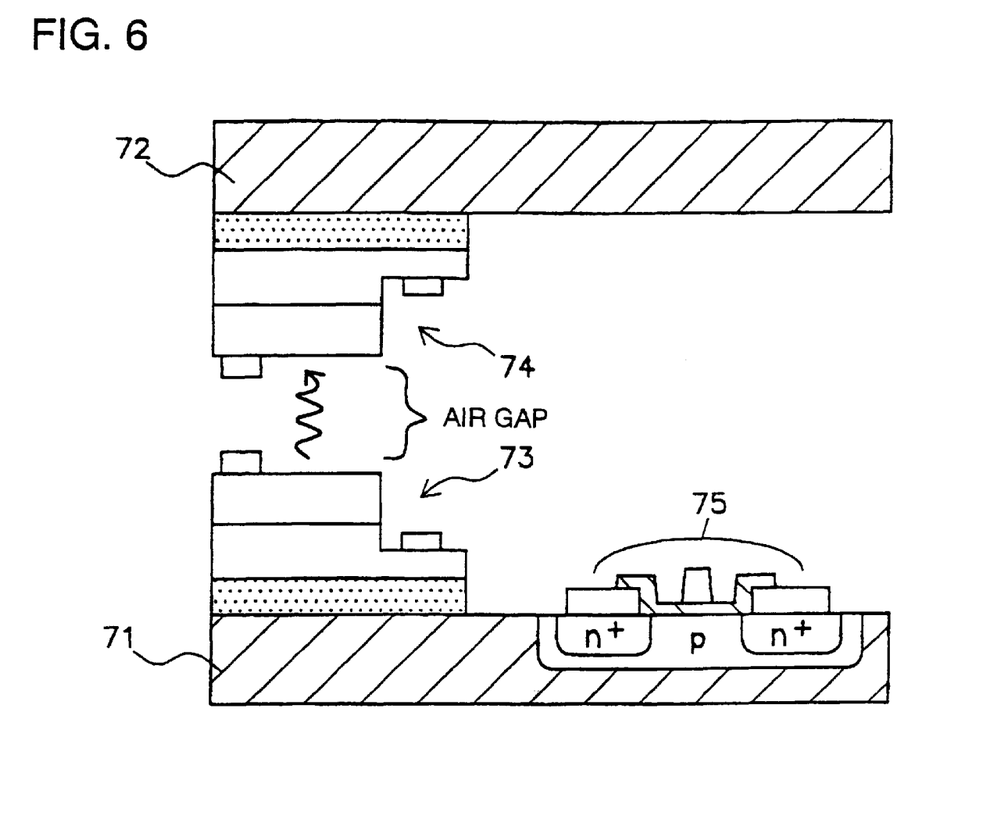
FIG. 6 is a cross sectional view showing an OEIC according to a further embodiment of the present invention.

The OEIC of the present invention is not be limited to the examples described in the above embodiments. For example, it is also possible that two silicon substrate plates for forming one OEIC may be arranged facing each other in a manner such that two light emitting/receiving layers 73 and 74 are placed one upon another (FIG. 6) so as to form a composite type OEIC. By virtue of the formation of such a structure, one can form an OEIC in which the light emitting/receiving layer 73 is controlled by the MOSFET 75 formed on the silicon substrate 71, and an optical signal from the light emitting/receiving layer 73 is converted into an electric signal, with the same function being obtainable for the light emitting/receiving layer 73 formed on the silicon substrate 72. Under such circumstance, it is only necessary to form a space (an air gap) between the two luminescent layers 73 and 74 without a necessity of forming a SiO$_2$ film.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of forming an optical electronic integrated circuit, comprising the steps of:

providing a silicon substrate including an electronic circuit for processing an electric signal;

forming a ZnO layer on at least a portion of the silicon substrate; and forming an optical circuit electrically connected to the electronic circuit and comprising at least one GaN-based semiconductor compound layer on the ZnO layer, wherein the GaN-based semiconductor compound layer either receives or emits an optical signal; and wherein the GaN-based semiconductor compound layer is formed at a temperature of 800° C. or lower; and further comprising the step of forming an additional layer of ZnO optically connected to the optical circuit and dimensioned so as to function as an optical waveguide.

2. A method of forming an optical electronic integrated circuit according to claim 1, further comprising the step of forming a SiO$_2$ layer between the silicon substrate and the ZnO layer, and wherein the ZnO film is optically connected to the optical circuit so as to act as an optical waveguide.

3. A method of forming an optical electronic integrated circuit according to claim 2, wherein the silicon substrate includes a MOSFET and wherein the ZnO layer is initially formed so as to cover that portion of the silicon substrate which includes the MOSFET and is thereafter eliminated from said portion.

4. A method of forming an optical electronic integrated circuit according to claim 2, wherein the silicon substrate includes a MOSFET and wherein the ZnO layer is initially formed so as to cover that portion of the silicon substrate which includes the MOSFET and is thereafter eliminated from said portion.

5. A method according to claim 1, wherein the GaN-based semiconductor compound layer is formed by the ECR-MBE method.

6. A method according to claim 1, wherein the GaN-based semiconductor compound layer is Ga$_{1-x}$In$_x$N, Ga$_{1-x}$Al$_x$N, Ga$_{1-x}$B$_x$N or a mixed crystal thereof.

7. A method according to claim 1, wherein the electronic circuit comprises at least one MOSFET.

8. A method according to claim 1, wherein the optical circuit includes at least one member selected from the group consisting of a light emitting diode, a laser and a photodiode.

9. A method according to claim 1, wherein the ZnO layer does not cover the electronic circuit.

10. A method according to claim 1, wherein the ZnO layer covers the electronic circuit.

11. A method of forming an optical electronic integrated circuit, comprising the steps of:

providing a silicon substrate including an electronic circuit for processing an electric signal;

forming a ZnO layer on at least a portion of the silicon substrate; and forming an optical circuit electrically connected to the electronic circuit and comprising at least one GaN-based semiconductor compound layer on the ZnO layer, wherein the GaN-based semiconductor compound layer either receives or emits an optical signal; and further comprising the step of forming an additional layer of ZnO optically connected to the optical circuit and dimensioned so as to function as an optical waveguide.

12. A method according to claim 11, wherein the GaN-based semiconductor compound layer is Ga$_{1-x}$In$_x$N, Ga$_{1-x}$Al$_x$N, G$_{1-x}$B$_x$N or a mixed crystal thereof.

13. A method according to claim 11, wherein the electronic circuit comprises at least one MOSFET.

14. A method according to claim 11, wherein the optical circuit includes at least one member selected from the group consisting of a light emitting diode, a laser and a photodiode.

15. A method according to claim 11, wherein the ZnO layer does not cover the electronic circuit.

16. A method according to claim 11, wherein the ZnO layer covers the electronic circuit.

17. A method of forming an optical electronic integrated circuit according to claim 11, further comprising the step of forming a SiO$_2$ layer between the silicon substrate and the ZnO layer, and wherein the ZnO film is optically connected to the optical circuit so as to act as an optical waveguide.

18. A method of forming an optical electronic integrated circuit, comprising the steps of:

providing a silicon substrate including an electronic circuit for processing an electric signal;

forming a ZnO layer on at least a portion of the silicon substrate; and forming an optical circuit electrically connected to the electronic circuit and comprising at least one GaN-based semiconductor compound layer on the ZnO layer, wherein the GaN-based semiconductor compound layer either receives or emits an optical signal; and wherein the GaN-based semiconductor compound layer is formed by the ECR-MBE method; and further comprising the step of forming an additional layer of ZnO optically connected to the optical circuit and dimensioned so as to function as an optical waveguide.

19. A method of forming an optical electronic integrated circuit according to claim 18, further comprising the step of forming a SiO$_2$ layer between the silicon substrate and the ZnO layer, and wherein the ZnO film is optically connected to the optical circuit so as to act as an optical waveguide.

* * * * *

UNITED STATES PATENT AND TRADEMARK OFFICE
CERTIFICATE OF CORRECTION

PATENT NO. : 6,458,614 B1
APPLICATION NO. : 09/272703
DATED : October 1, 2002
INVENTOR(S) : Yasushi Nanishi It is certified that error appears in the above-identified patent and that said Letters Patent is hereby corrected as shown below:

On Title Page

Please add:

[30]  Foreign Application Priority Data
         March 26, 1998  [JP]    Japan …….. 10-79421

Signed and Sealed this

Twenty-sixth Day of December, 2006

JON W. DUDAS
*Director of the United States Patent and Trademark Office*